United States Patent
Lee

(10) Patent No.: US 9,958,486 B2
(45) Date of Patent: May 1, 2018

(54) CIRCUIT FOR DETECTING A KNEE OF WAVEFORM

(71) Applicant: Feeling Technology Corp., Chupei, Hsinchu (TW)

(72) Inventor: Hsiwen Lee, Chupei (TW)

(73) Assignee: Feeling Technology Corp., Chupei, Hinchu (TW)

( * ) Notice: Subject to any disclaimer, the term of this patent is extended or adjusted under 35 U.S.C. 154(b) by 270 days.

(21) Appl. No.: 14/923,115

(22) Filed: Oct. 26, 2015

(65) Prior Publication Data
US 2016/0370409 A1 Dec. 22, 2016

(30) Foreign Application Priority Data
Jun. 18, 2015 (TW) .............................. 104119759 A

(51) Int. Cl.
*G01R 23/00* (2006.01)
*G01R 19/25* (2006.01)
*G01R 13/02* (2006.01)

(52) U.S. Cl.
CPC ....... *G01R 23/005* (2013.01); *G01R 19/2509* (2013.01); *G01R 13/0254* (2013.01)

(58) Field of Classification Search
CPC . H02M 3/33507; G01R 19/10; G01R 23/005; G01R 19/2509; G01R 13/0254
See application file for complete search history.

(56) References Cited

U.S. PATENT DOCUMENTS

| 7,505,287 | B1 * | 3/2009 | Kesterson | H02M 3/33507 363/21.01 |
| 2009/0290390 | A1 * | 11/2009 | Piper | H02M 3/33507 363/21.04 |
| 2013/0181635 | A1 * | 7/2013 | Ling | H02M 3/33507 315/297 |
| 2015/0160270 | A1 * | 6/2015 | Shi | G01R 19/0084 363/21.13 |
| 2015/0326129 | A1 * | 11/2015 | Lin | H02M 3/33507 363/21.12 |

\* cited by examiner

*Primary Examiner* — Jermele M Hollington
*Assistant Examiner* — Feba Pothen
(74) *Attorney, Agent, or Firm* — Muncy, Geissler, Olds & Lowe, P.C.

(57) ABSTRACT

A circuit for detecting a knee of waveform is disclosed in the present invention. The circuit detects the knee and a total oscillation time of a voltage waveform as a load switch of load circuit is turned off. In the circuit, a filter filters the voltage waveform to transmit a reference voltage to a first and a second comparator. When the first and the second comparator determine that the voltage waveform achieves a sum of the reference voltage and a set voltage, the first and the second comparator transmit a first and a second signal to a knee detection module. When the knee detection module receives the first signal rather than the second signal in an oscillation time, or receives the second signal rather than the first signal in the oscillation time, the knee detection module records the knee and trigger a time recorder computes the total oscillation time.

9 Claims, 13 Drawing Sheets

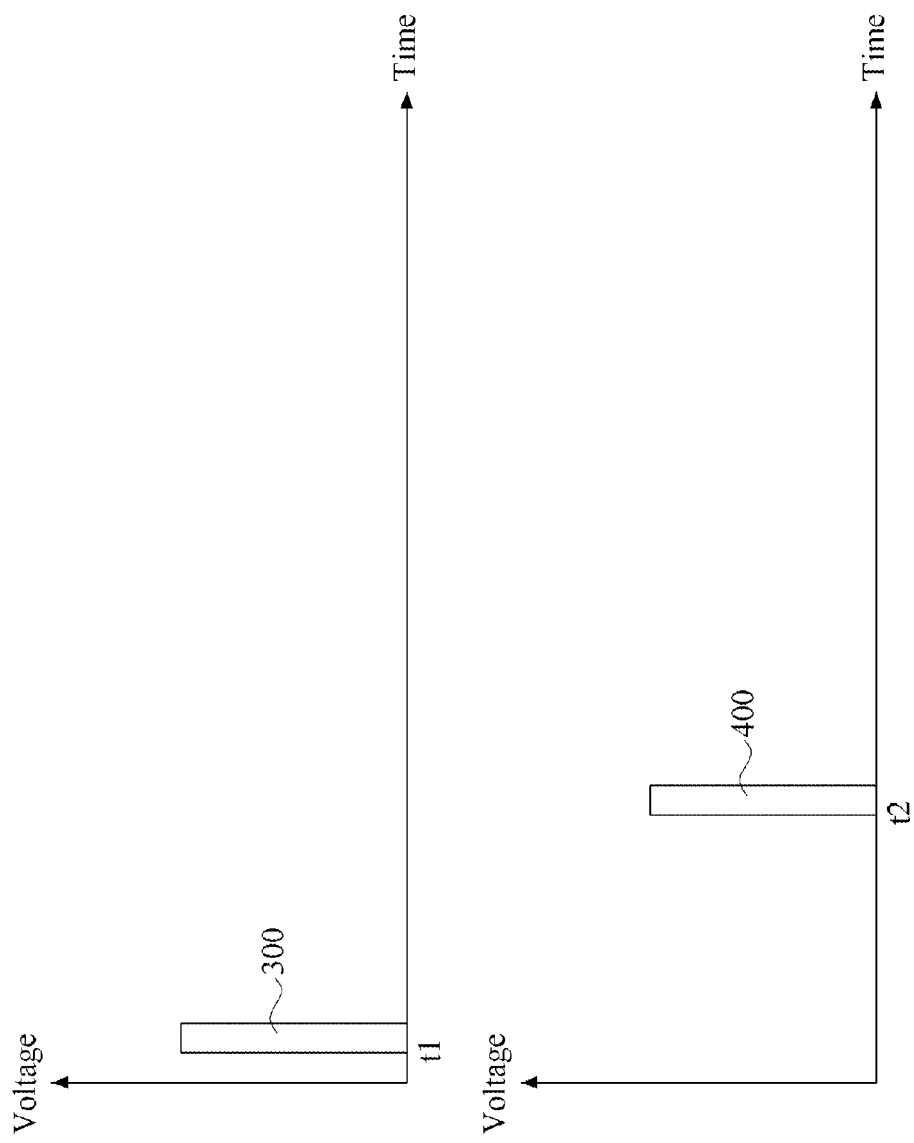

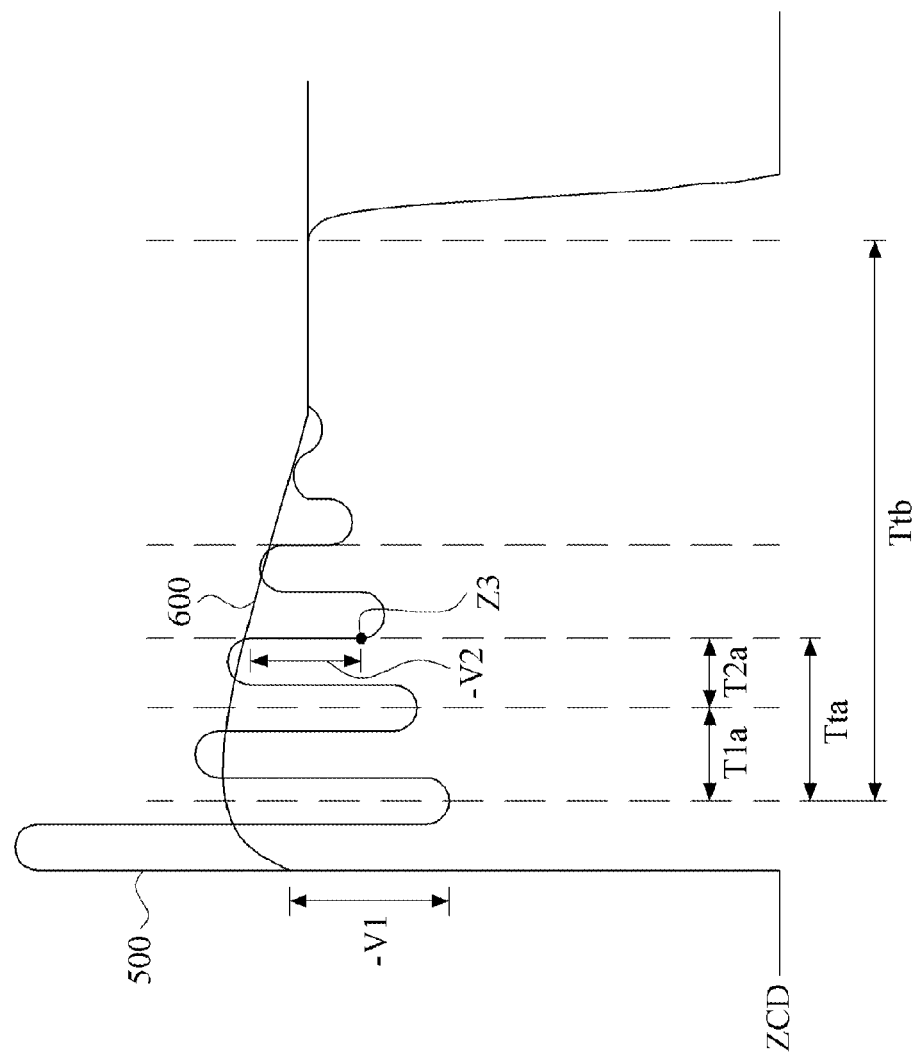

US 9,958,486 B2

CIRCUIT FOR DETECTING A KNEE OF WAVEFORM

This application claims the benefit of Taiwan Patent Application Serial No. 104119759, filed Jun. 18, 2015, the subject matter of which is incorporated herein by reference.

BACKGROUND OF INVENTION

1. Field of the Invention

The present invention is related to a circuit for detecting a knee of a waveform, and more particularly related to a circuit for detecting a knee of a waveform by using two comparators to detect the knee of the voltage waveform and the total oscillating time.

2. Description of the Prior Art

FIG. 1 is a circuit diagram of a conventional isolated load circuit. As shown, a driving circuit PA1 is utilized for driving the isolated load circuit PA2. The isolated load circuit PA2 includes an isolated transformer PA21, which includes a primary side winding PA211, a secondary side winding PA212, and an auxiliary winding PA213, a switch PA22, and at least one operating element PA23, which is a light emitted diode in general and three operating elements are showed in the figure. The switch PA22 is electrically connected to the primary side winding PA211 of the isolated transformer PA21. The operating elements PA23 are electrically connected to the secondary side winding PA212 of the isolated transformer PA21. The electrical connection of the isolated load circuit PA2 is well known in the art and thus is not repeated here.

Please also refer to FIG. 2, which is a waveform diagram showing voltage of the conventional isolated transformer PA21. As shown, when the switch PA22 is turned off, the energy store in the primary side winding PA211 would be transferred to the secondary side winding PA212 and the auxiliary winding PA213 of the isolated transformer PA21 making use of Faraday's law. A stable average current Ia is necessary for the operating elements PA23. Because the auxiliary winding PA213 and the secondary side winding PA212 have the same winding direction, the voltage difference between two sides of those windings would be proportional to the number of turns when the two windings as the switch PA22 is turned off. The voltage of the secondary side winding PA212 is further divided by the resistors PA24 and PA25 to generate the voltage at the end of the zero crossing detecting (ZCD) of the driving circuit PA1. The knee detected at the end of ZCD, the driving circuit PA1 can be used to determine the amount of energy in the secondary side winding PA212 of the isolated transformer PA21 for deciding on/off time of the switch PA22 to achieve the average current. In the other cases, the voltage level at the FB end, i.e. the feedback voltage, can be used to determine the on/off time of the switch PA22. However, as the switch PA22 is turned off, the knee detected at the end of ZCD, the driving circuit PA1 would be influenced by the primary side winding PA211 and the noise on the switch PA22, such that the voltage oscillating waveform 100 would be generated and further result in the unstable average current Ia. Accordingly, an improvement for stabilizing the average current Ia is highly desirable.

SUMMARY OF THE INVENTION

In view of the above, under the restriction of existing circuit designs, the unstable average current due to the voltage oscillating waveform generated at the ZCD end of the driving circuit PA1 when the switch is turned off is a general problem. Accordingly, a circuit for detecting a knee of a waveform is provided for controlling the average current by using the detected precise knee of the voltage oscillating waveform and the total oscillating time so as to resolve the above mentioned problem.

According to the above mentioned object, a circuit for detecting a knee of waveform is provided in accordance with the present invention. The circuit for detecting a knee of waveform is applicable to an isolated load circuit, which includes an isolated transformer with a primary side winding, a second side winding, and an auxiliary winding, a switch, and at least one operating element, wherein the switch is electrically connected to the primary side winding of the isolated transformer, the operating element is electrically connected to the secondary side winding of the isolated transformer, and the auxiliary winding is disposed at the same side of the primary winding. The circuit for detecting a knee of waveform is utilized for detecting a knee of a voltage oscillating waveform of the auxiliary winding and a total oscillating time as the switch is turned off so as to control an average output current flowing through the operating element by using the knee and the total oscillating time to control the on/off signal of the switch. The circuit for detecting a knee of waveform comprises a filter, a first comparator, a second comparator, a time recorder, and a knee detecting module. The filter is electrically connected to the auxiliary winding for receiving and filtering the voltage oscillating waveform to generate a filtered voltage. The first comparator has a first comparing input, a second comparing input, and a first comparing output. The first comparing input is electrically connected to the filter through a first switch for receiving at least a first reference voltage which is a difference between the filtered voltage and a first preset voltage and is positive. The second comparing input is electrically connected to the auxiliary winding for receiving the voltage oscillating waveform. The first comparing output is utilized for transmitting a first signal as the voltage oscillating waveform is lower than the first reference voltage. The second comparator has a third comparing input, a fourth comparing input, and a second comparing output. The third comparing input is electrically connected to the filter through a second switch for receiving at least one second reference voltage which is a difference between a reference stabilized voltage and a second preset voltage and is greater than the first reference voltage. The second preset voltage is positive. The fourth comparing input is electrically connected to the auxiliary winding for receiving the voltage oscillating waveform. The second comparing output is utilized for transmitting a second signal as the voltage oscillating waveform is lower than the second reference voltage. The time recorder is electrically connected to the first comparing output of the first comparator, the second comparing output of the second comparator, the first switch, and the second switch for recording the total oscillating time. The knee detecting module is electrically connected to the first comparator, the second comparator, and the time recorder, for receiving at least one of the first signal and the second signal to control the time recorder accordingly.

Wherein, as the first switch is conducted, the time recorder counts a first oscillating time, the knee detecting module triggers the time recorder to recount the first oscillating time when the knee detecting module receives the first signal, and the knee detecting module triggers the time recorder to record the first oscillating time when the knee detecting module does not receive the first signal within the first oscillating time and further conducts the second switch to count a second oscillating time, the knee detecting module triggers the time recorder to recount the second oscillating time when the knee detecting module receives the second signal, and the knee detecting module triggers the time recorder to record the second oscillating time when the knee detecting module does not receive the second signal within the second oscillating time, and the knee detecting module detects the knee and triggers to the time recorder to sum up the first oscillating time and the second oscillating time to record the total oscillating time when the knee detecting module does not receive the second signal within the second oscillating time but receives the first signal.

In accordance with a preferred embodiment of the above mentioned circuit for detecting a knee of waveform, the time recorder comprises a timer and a counter. The timer is electrically connected to the first comparing output of the first comparator, the second comparing output of the second comparator, for transmitting a trigger signal when the knee detecting module does not receive the first signal within the first oscillating time. The counter is electrically connected to the timer, the first switch, and the second switch, for conducting the second switch when receiving the trigger signal. In addition, the operating element is a light emitted diode, the first signal and the second are digital high level signals, and the circuit for detecting a knee of waveform further comprises a time shielding device, which is electrically connected between the filter and the auxiliary winding to delay the voltage oscillating waveform transmitted to the filter for a delay time. In addition, the filter includes a resistor and a capacitor, the resistor is electrically connected to the auxiliary winding, and the capacitor has one end electrically connected to the resistor and another end grounded. The time recorder is set with an oscillating threshold time. The first oscillating time counted by the time recorder is set as identical to the oscillating threshold time when the knee detecting module does not receive the first signal within the oscillating threshold time, but the second oscillating time counted by the time recorder is set as identical to the oscillating threshold time when the knee detecting module does not receive the second signal within the oscillating threshold time.

In accordance with a preferred embodiment of the above mentioned circuit for detecting a knee of waveform, the knee detecting module comprises a first detecting switch, a second detecting switch, a third detecting switch, a fourth detecting switch, and a processing unit. The first detecting switch is electrically connected to the first comparator and the time recorder. The second detecting switch is electrically connected to the first comparator and the time recorder. The third detecting switch is electrically connected to the second comparator and the time recorder. The fourth switch is electrically connected to the second comparator and the time recorder. The processing unit is electrically connected to the first detecting switch and the third detecting switch. Wherein, within the first oscillating time, the first detecting switch and the fourth detecting switch are conducted by the time recorder, and the second detecting switch and the third detecting switch are turned off by the time recorder, and within the second oscillating time, the second detecting switch and the third detecting switch are conducted by the time recorder, and the first detecting switch and the fourth detecting switch are turned off by the time recorder.

In accordance with a preferred embodiment of the above mentioned circuit for detecting a knee of waveform, the first comparing input of the first comparator is electrically connected to the filter through a third switch, the third comparing input of the second comparator is electrically connected to the filter through a fourth switch. The circuit for detecting a knee of waveform further comprises a third comparator and a fourth comparator. The third comparator has a fifth comparing input, a sixth comparing input, and a third comparing output. The fifth comparing input is electrically connected to the filter through a fifth switch and also electrically connected to the filter through a seventh switch. The fifth comparing input is utilized for receiving at least a third reference voltage which is a sum of the reference stabilized voltage and the first preset voltage. The sixth comparing input is electrically connected to the auxiliary winding for receiving the voltage oscillating waveform. The third comparing output is utilized for transmitting a third signal as the voltage oscillating waveform reaches the third reference voltage. The fourth comparator has a seventh comparing input, an eighth comparing input, and fourth comparing output. The seventh comparing input is electrically connected to the filter through a seventh switch and also electrically connected to the filter through an eighth switch. The seventh comparing input is utilized for receiving at least a fourth reference voltage which is a sum of the reference stabilized voltage and the second preset voltage and also smaller than the third reference voltage. The eighth comparing input is electrically connected to the auxiliary winding for receiving the voltage oscillating waveform. The fourth comparing output is utilized for transmitting a fourth signal as the voltage oscillating waveform reaches the fourth reference voltage. Wherein, the knee detecting module is electrically connected to the first comparator, the second comparator, the third comparator, the fourth comparator, and the time recorder. As the first switch, the second switch, the fifth switch, the sixth switch, the first detecting switch and the fourth detecting switch are conducted, the knee detecting module triggers the time recorder to recount the second oscillating time when the knee detecting module receives the second signal or the fourth signal, records the second oscillating time when the knee detecting module does not receive the second signal or the fourth signal within the second oscillating time, and the processing unit records the knee when the knee detecting module receives the first signal or the third signal. As the third switch, the fourth switch, the seventh switch, the eighth switch, the second detecting switch and the third detecting switch are conducted, the knee detecting module triggers the time recorder to recount the first oscillating time when the knee detecting module receives the first signal or the third signal, triggers the time recorder to recount the first oscillating time when the knee detecting module does not receive the first signal or the third signal within the first oscillating time, and the processing unit records the knee when the knee detecting module receives the second signal or the fourth signal.

In accordance with a preferred embodiment of the above mentioned circuit for detecting a knee of waveform, the third signal and the fourth signal are digital high level signals. The knee detecting module further comprises a first NOR gate and a second NOR gate. The first NOR gate is electrically connected to the first comparator, the third comparator, the first detecting switch, and the second detecting switch, for computing logic NOR of the first signal and the third signal. The second NOR gate is electrically connected to the second comparator, the fourth comparator, the third detecting switch, and the fourth detecting switch, for computing logic NOR of the second signal and the fourth signal.

By using the technology provided in the circuit for detecting a knee of waveform of the present invention, the precise knee can be detected and the total oscillating time can be calculated such that a compensating current can be computed by accessing the voltage and the total oscillating time at the actual knee so as to provide a stabilized average current for the operating element to resolve the above mentioned problem of the conventional art.

BRIEF DESCRIPTION OF THE DRAWINGS

The present invention will now be specified with reference to its preferred embodiment illustrated in the drawings, in which:

FIG. 5A is a diagram showing the waveform of the first signal and the second signal in accordance with a first preferred embodiment of the present invention.

FIG. 7 is a waveform diagram showing the reference stabilized voltage under the influence of the voltage oscillating waveform in accordance with the other embodiment of the present invention.

DESCRIPTION OF THE PREFERRED EMBODIMENT

There are various embodiments of the circuit for detecting a knee of waveform in accordance with the present invention, which are not repeated hereby. Only two preferred embodiments are mentioned in the following paragraph as an example.

Figure 1:
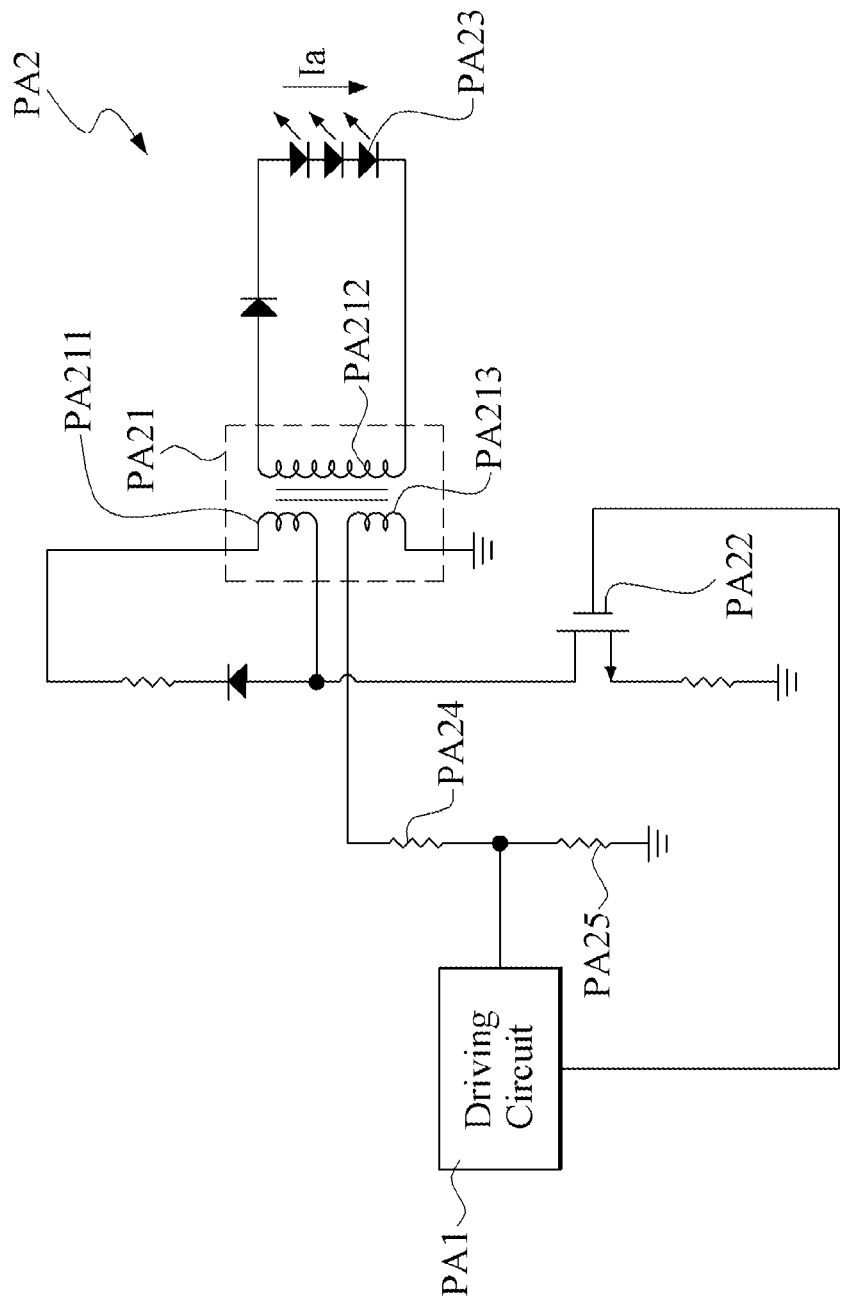
FIG. 1 is a circuit diagram of a conventional isolated load circuit.
Figure 2:
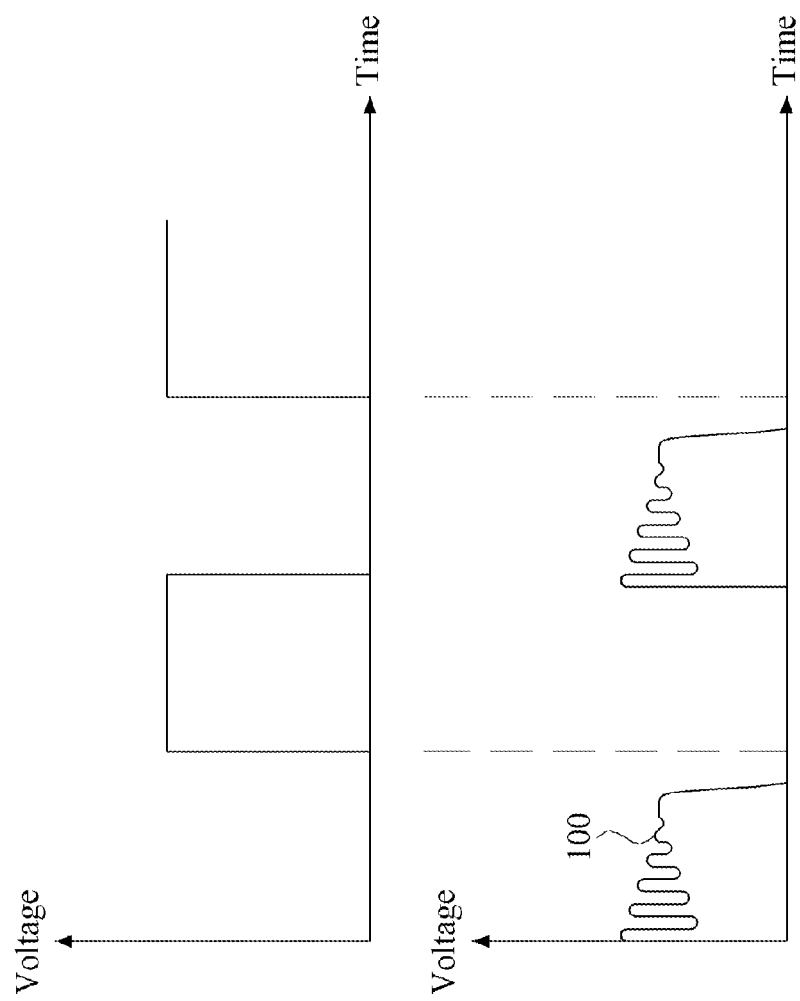
FIG. 2 is a diagram showing a voltage oscillating waveform of the conventional art.
Figure 3:
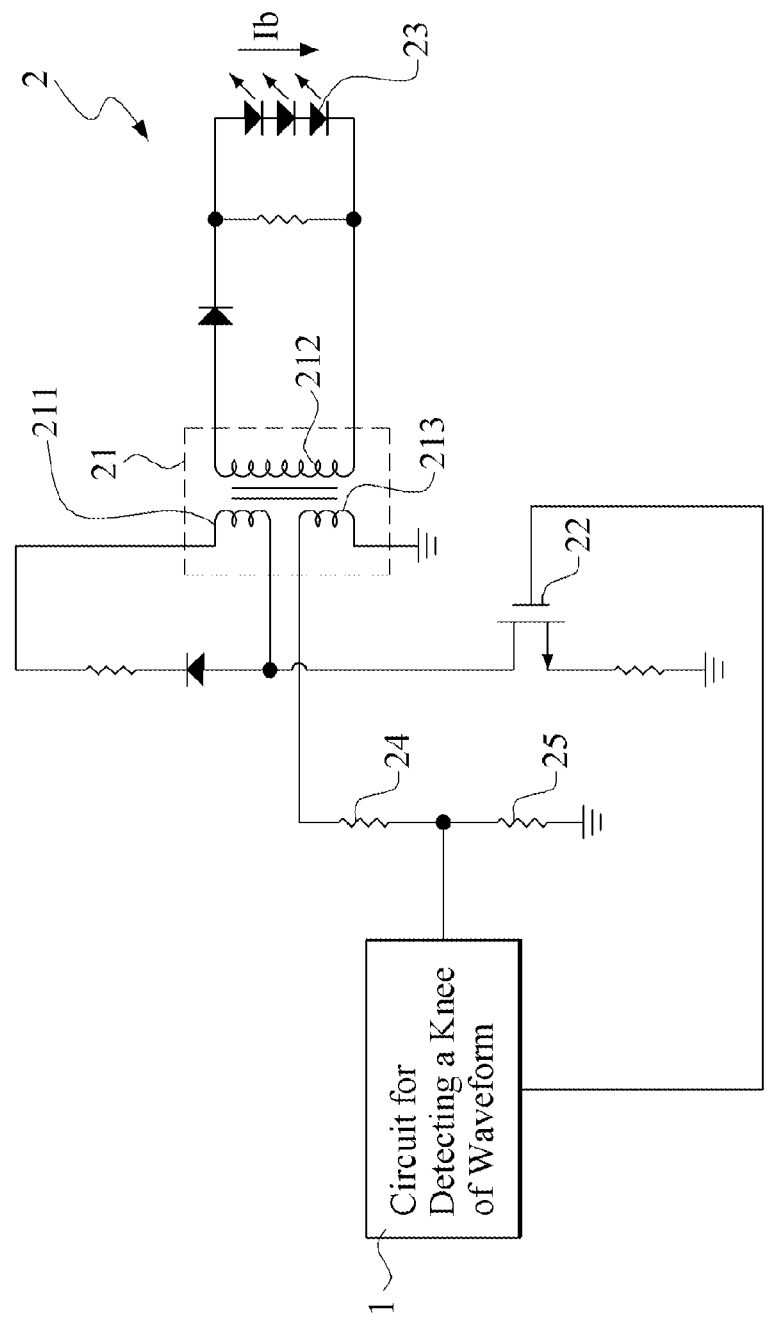
FIG. 3 is a circuit diagram of an isolated load circuit in accordance with a first preferred embodiment of the present invention.
Figure 4:
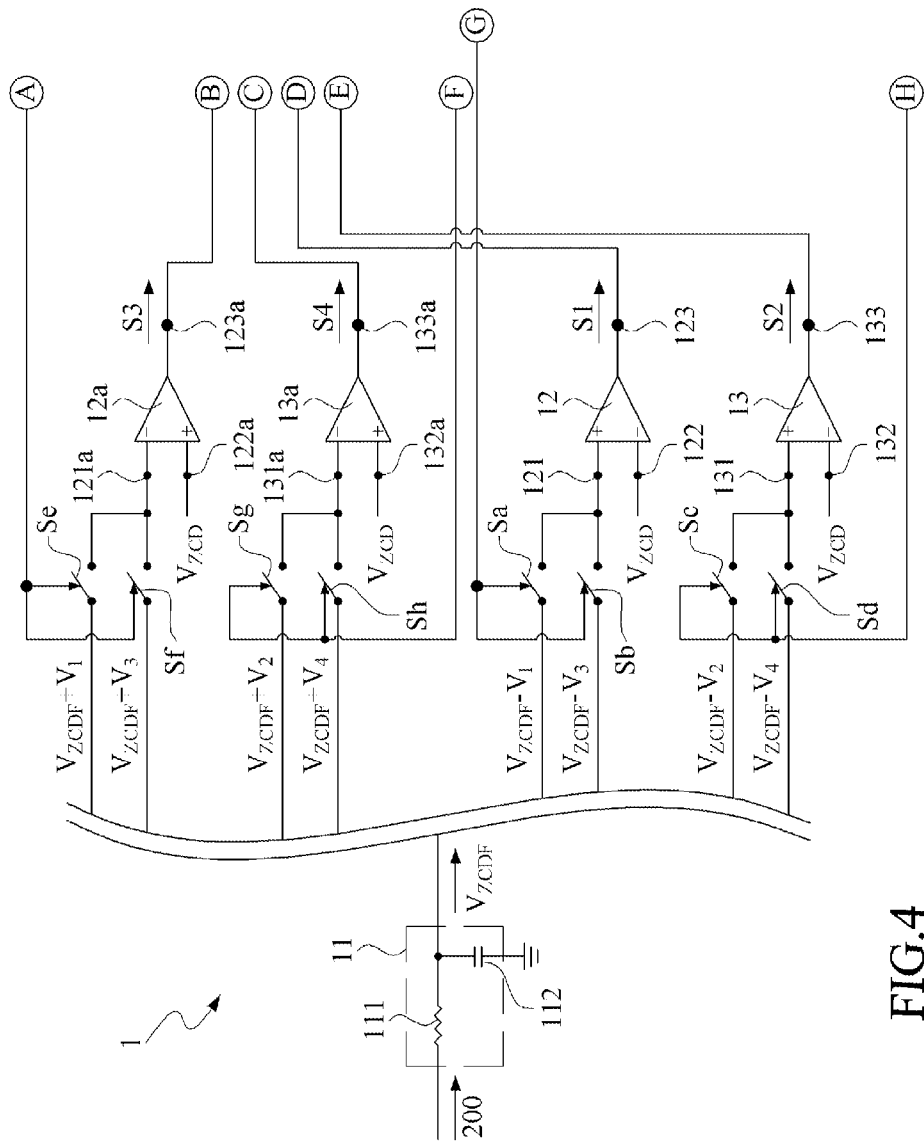
FIGS. 4 and 4A are circuit diagrams showing the circuit for detecting a knee of waveform in accordance with a first preferred embodiment of the present invention.
Figure 4A:
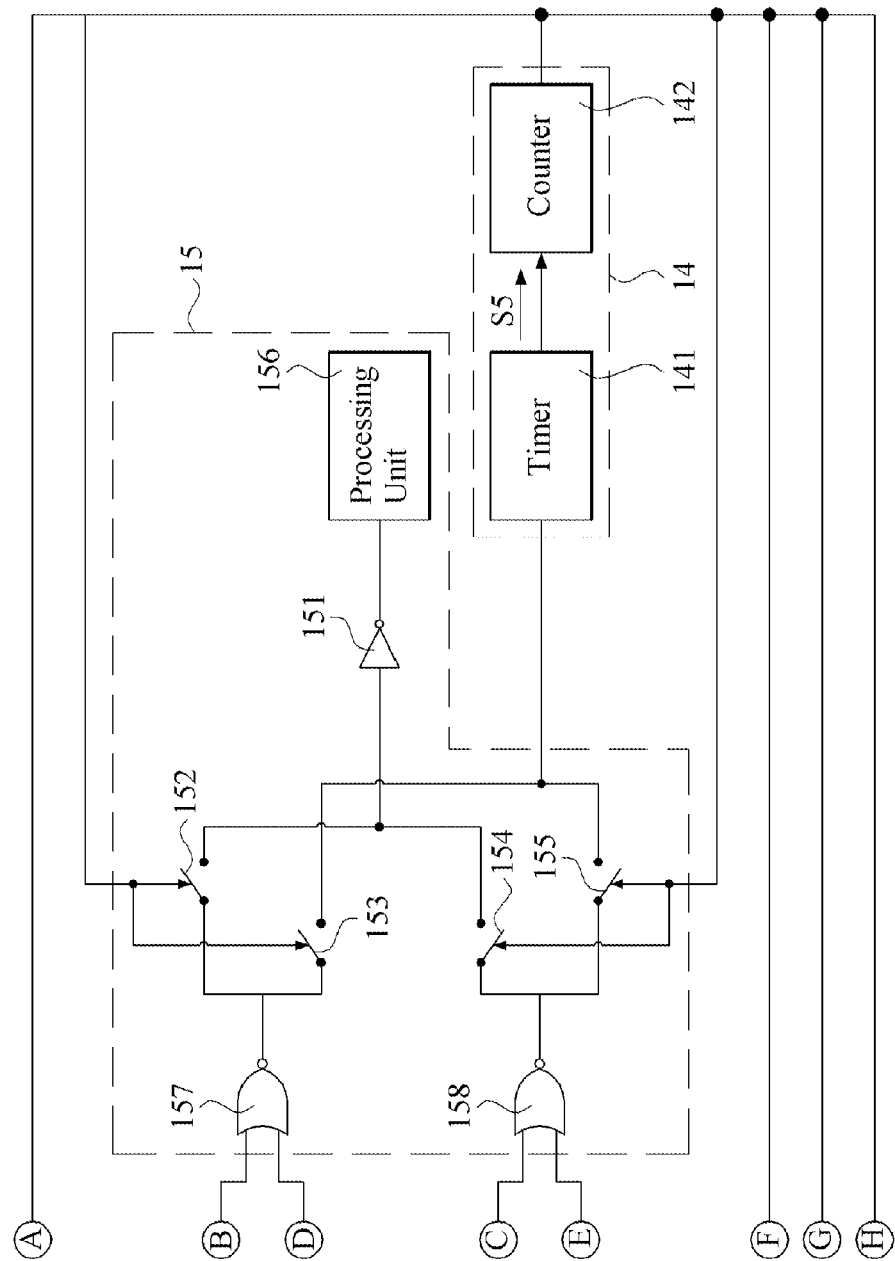
Figure 5:
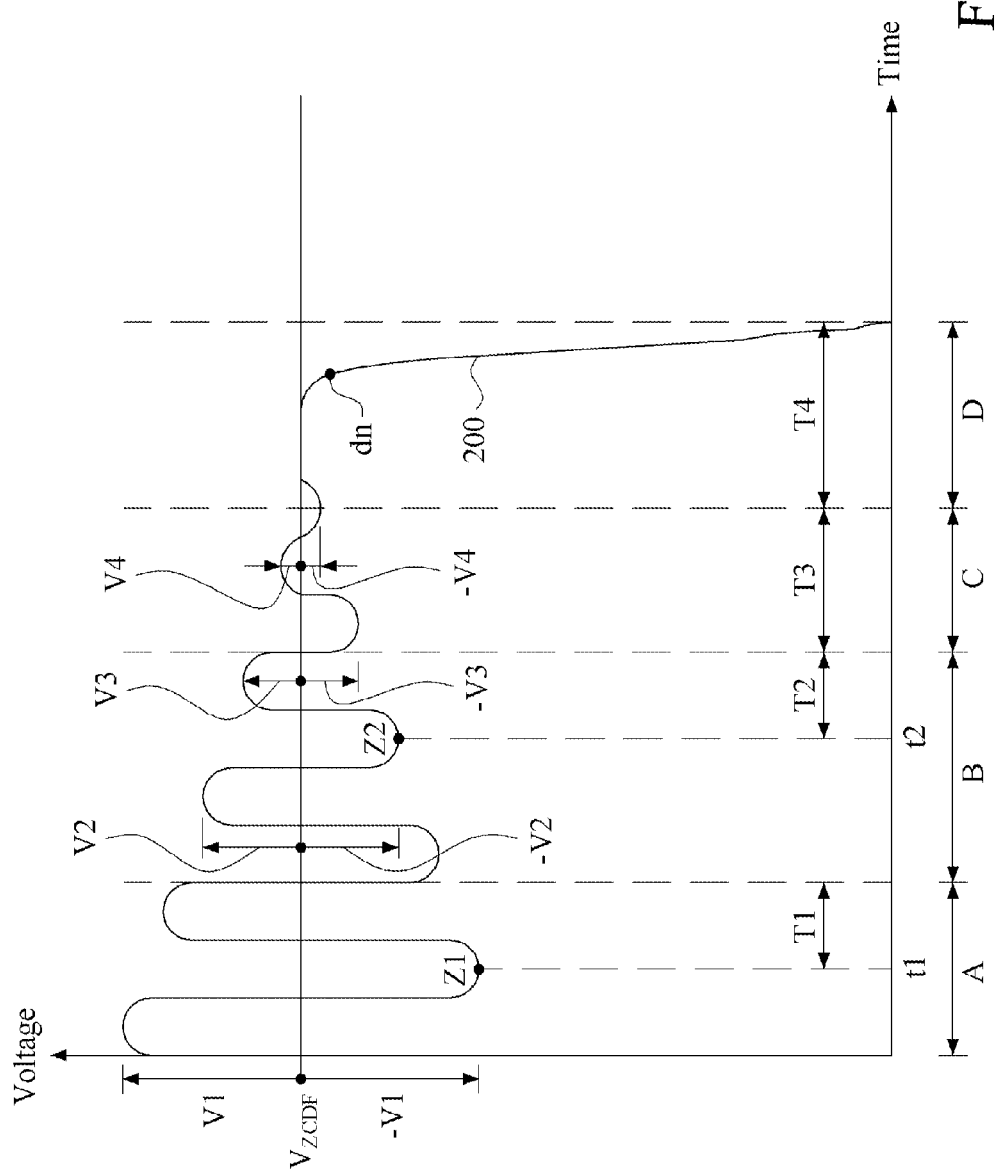
FIG. 5 is a diagram showing a voltage oscillating waveform in accordance with a first preferred embodiment of the present invention.

Please refer to FIG. 3 to FIG. 5A, wherein FIG. 3 is a circuit diagram of an isolated load circuit in accordance with a first preferred embodiment of the present invention, FIGS. 4 and 4A are circuit diagrams showing the circuit for detecting a knee of waveform in accordance with a first preferred embodiment of the present invention, FIG. 5 is a diagram showing a voltage oscillating waveform in accordance with a first preferred embodiment of the present invention, and FIG. 5A is a diagram showing the waveform of the first signal and the second signal in accordance with a first preferred embodiment of the present invention.

As shown, a circuit for detecting a knee of waveform in accordance with a preferred embodiment of the present invention is applicable to an isolated load circuit 2, which includes an isolated transformer 21 with a primary side winding 211, a second side winding 212, and an auxiliary winding 213, a switch 22, and at least one operating element 23, a resistor 24, and a resistor 25. The switch 22 is electrically connected to the primary side winding 211 of the isolated transformer 21, the operating element 23 is electrically connected to the secondary side winding 212 of the isolated transformer 21, and the auxiliary winding 213 is disposed at the same side of the primary winding 211. The operating element 23 is a light emitted diode (LED). The resistor 24 is electrically connected to the resistor 25 and the auxiliary winding 213 of the isolated transformer 21. In addition, the isolated load circuit 2 may also includes the circuitry components, such as the inductor, the capacitor, the full bridge rectifier, the diode, and etc., which are not labeled in the figures, and the coupling of these components is well known in the art and thus is not repeated here. The circuit 1 for detecting a knee of waveform is utilized for detecting a total oscillating time (defined as Tt in the present embodiment) of a voltage oscillating waveform 200 on the auxiliary winding 213 as the switch 22 is turned off, so as to generate an average output current Ib flowing through the operating element 23 by using the total oscillating time Tt to control the switch 22.

The circuit 1 for detecting a knee of waveform includes a filter 11, a first comparator 12, a second comparator 13, a third comparator 12a, a fourth comparator 13a, and a time recorder 14. In the other embodiment of the present invention, the circuit 1 for detecting a knee of waveform may also include a primary side regulation (PSR) circuit. The filter 11 is a RC filter, but the present invention is not so restricted. The filter 11 includes a resistor 111 and a capacitor 112. The resistor 111 is electrically connected to the auxiliary winding 213 (not shown). Concretely speaking, the resistor 111 is electrically connected to the resistors 24 and 25, and the resistors 24 and 25 are electrically connected to the auxiliary winding 213 as the divider resistors for the auxiliary winding 213. The capacitor 112 has one end electrically connected to the resistor 111 and another end grounded. Concretely speaking, as the switch 22 is turned off, the voltage oscillating waveform 200 would be generated on the auxiliary winding 213. The filter 11 receives and filters the voltage oscillating waveform 200 so as to output a filtered voltage $V_{ZCDF}$ as shown in FIG. 5. The filtered voltage $V_{ZCDF}$ has a fixed level.

The first comparator 12 has a first comparing input 121, a second comparing input 122, and a first comparing output 123. The first comparing input 121 is electrically connected to the filter 11 through a first switch Sa, and is electrically connected to the capacitor 112 of the filter 11 through a third switch Sb. That is, the first comparing input 121 may receive two different input signals, and it is noted that the first comparing input 121 receives at least a first reference voltage (i.e. a voltage difference) Va, Vb, and as shown in FIG. 4, the end corresponding to the first switch Sa has the level of the voltage difference Va, which is the difference between the filtered voltage $V_{ZCDF}$ and a first preset voltage V1 (i.e. $V_{ZCDF}$–V1), and the end corresponding to the third switch Sb has the level of the voltage difference Vb, which is the difference between the filtered voltage $V_{ZCDF}$ and a third preset voltage V3 (i.e. $V_{ZCDF}$–V3). Both the first preset voltage V1 and the third preset voltage V3 are positive, and the third preset voltage V3 is smaller than the first preset voltage V1. The second comparing input 122 of the first comparator 12 is electrically connected to the resistors 24, 25 connected to the auxiliary winding 213.

The second comparator 13 has a third comparing input 131, a fourth comparing input 132, and a second comparing output 133. The third comparing input 131 is electrically connected to the filter 11 through a second switch Sc, and is also electrically connected to the filter 11 through a fourth switch Sd. That is, the third comparing input 131 may have two different input signals, and it is noted that the third comparing input 131 receives at least a second reference voltage (i.e. a voltage difference) Vc, Vd, and as shown in FIG. 4, the end corresponding to the second switch Sc has the voltage difference Vc, which is the difference between the filtered voltage $V_{ZCDF}$ and a second preset voltage V2 (i.e. $V_{ZCDF}$–V2), and the end corresponding to the fourth switch Sd has the voltage difference Vd, which is the difference between the filtered voltage $V_{ZCDF}$ and a fourth preset voltage V4 (i.e. $V_{ZCDF}$–V4). Both the second preset voltage V2 and the fourth preset voltage V4 are positive, and the fourth preset voltage V4 is smaller than the second preset voltage V2. Concretely speaking, the fourth preset voltage V4 is smaller than the third preset voltage V3, which is smaller than the second preset voltage V2, which is smaller than the first preset voltage V1 (i.e. V4<V3<V2<V1). The fourth comparing input 132 of the second comparator 13 is electrically connected to the resistors 24, 25 connected to the auxiliary winding 213.

The third comparator 12a has a fifth comparing input 121a, a sixth comparing input 122a, and a third comparing output 123a. The fifth comparing input 121a is electrically connected to the capacitor 112 of the filter 11 through a fifth switch Se, and is electrically connected to the filter 11 through a seventh switch Sf. That is, the fifth comparing input 121a may receive two different input signals, and it is noted that the fifth comparing input 121a receives at least a third reference voltage Ve, Vf, and as shown in FIG. 4, the end corresponding to the fifth switch Se has the reference voltage Ve, which is the sum of the filtered voltage $V_{ZCDF}$ and a first preset voltage V1, and the end corresponding to the seventh switch Sf has the reference voltage Vf, which is the sum of the filtered voltage $V_{ZCDF}$ and a third preset voltage V3. Both the first preset voltage V1 and the third preset voltage V3 are positive. The sixth comparing input 122a of the third comparator 12a is electrically connected to the resistors 24, 25 connected to the auxiliary winding 213.

The fourth comparator 13a has a seventh comparing input 131a, an eighth comparing input 132a, and a fourth comparing output 133a. The seventh comparing input 131a is electrically connected to the capacitor 112 of the filter 11 through a sixth switch Sg, and is electrically connected to the filter 11 through an eighth switch Sh. That is, the seventh comparing input 131a may receive two different input signals, and it is noted that the seventh comparing input 131a receives at least a fourth reference voltage Vg, Vh, and as shown in FIG. 4, the end corresponding to the sixth switch Sg has the reference voltage Vg, which is the sum of the filtered voltage $V_{ZCDF}$ and a second preset voltage V2, and the end corresponding to the eighth switch Sh has the reference voltage Vh, which is the sum of the filtered voltage $V_{ZCDF}$ and a fourth preset voltage V4. Both the second preset voltage V2 and the fourth preset voltage V4 are positive. The eighth comparing input 132a of the fourth comparator 13a is electrically connected to the resistors 24, 25 connected to the auxiliary winding 213.

The time recorder 14 is electrically connected to the first comparing output 123 of the first comparator 12, the second comparing output 133 of the second comparator 13, the third comparing output 123a of the third comparator 12a, the fourth comparing output 133a of the fourth comparator 13a, the first switch Sa, the second switch Sc, the third switch Sb, the fourth switch Sd, the fifth switch Se, the sixth switch Sg, the seventh switch Sf, and the eighth switch Sh. Concretely speaking, the time recorder 14 includes a timer 141 and a counter 142. The timer 141 is electrically connected to the first comparing output 123 of the first comparator 12, the second comparing output 133 of the second comparator 13, the third comparing output 123a of the third comparator 12a, and the fourth comparing output 133a of the fourth comparator 13a. The timer 141 may also include a comparator which is set with a first oscillating time T1, a second oscillating time T2, a third oscillating time T3, and a fourth oscillating time T4. These oscillating times may be identical or not, and for the embodiments of identical oscillating time, the oscillating time may be 1 us for example. The counter 142 is electrically connected to the timer 141, the first switch Sa, the second switch Sc, the third switch Sb, the fourth switch Sd, the fifth switch Se, the sixth switch Sg, the seventh switch Sf, and the eighth switch Sh.

The knee detecting module 15 is electrically connected to the first comparator 12, the second comparator 13, the third comparator 12a, the fourth comparator 13a, and the time recorder 14. Concretely speaking, the knee detecting module 15 includes a NOT gate 151, a first detecting switch 152, a second detecting switch 153, a third detecting switch 154, a fourth detecting switch 155, a processing unit 156, a first NOR gate 157, and a second NOR gate 158. The first NOR gate 157 is electrically connected to the first comparing output 123 and the third comparing output 123a. The second NOR gate 158 is electrically connected to the second comparing output 133 and the fourth comparing output 133a. The first detecting switch 152 and the second detecting switch 153 are electrically connected to first NOR gate 157 and the counter 142 of the time recorder 14. The third detecting switch 154 and the fourth detecting switch 155 are electrically connected to the second NOR gate 158 and the counter 142 of the time recorder 14. The NOT gate 151 is electrically connected to the first detecting switch 152, the third detecting switch 154, and the processing unit 156. The second detecting switch 153 and the fourth detecting switch 155 are electrically connected to the timer 141 of the time recorder 14. The processing unit 156 may be a chip or a circuitry with processing ability depends on the need in practice.

The second comparing input 122 is utilized for receiving the voltage oscillating waveform 200 (also represented by $V_{ZCD}$ in the figure). The first comparing output 123 is utilized for transmitting a first signal S1 as the level of the voltage oscillating waveform 200 is lower than the first reference voltage Va (equals to the difference of signal $V_{ZCDF}$ and the first reference voltage), Vb (equals to the difference of signal $V_{ZCDF}$ and the third reference voltage). The fourth comparing input 132 is utilized for receiving the voltage oscillating waveform 200. The second comparing output 133 is utilized for transmitting a second signal S2 as the level of the voltage oscillating waveform 200 is lower than the second reference voltage Vc (equals to the difference of signal $V_{ZCDF}$ and the second reference voltage), Vd (equals to the difference of signal $V_{ZCDF}$ and the fourth reference voltage). The sixth comparing input 122a is utilized for receiving the voltage oscillating waveform 200. The third comparing output 123a is utilized for transmitting a third signal S3 as the level of the voltage oscillating waveform 200 reaches the third reference voltage Ve (equals to the sum of signal $V_{ZCDF}$ and the first reference voltage), Vf (equals to the sum of signal $V_{ZCDF}$ and the third reference voltage). The eighth comparing input 132a is utilized for receiving the voltage oscillating waveform 200. The fourth comparing output 133a is utilized for transmitting a fourth signal S4 as the level of the voltage oscillating waveform 200 reaches the fourth reference voltage Vg (equals to the sum of signal $V_{ZCDF}$ and the second reference voltage), Vh (equals to the sum of signal $V_{ZCDF}$ and the fourth reference voltage). In accordance with a preferred embodiment of the present invention, only the first signal S1 and the second signal S2 are transmitted. The third signal S3 and the fourth signal S4 are identical to the first signal S1 and the second signal S2 and thus are not repeated here.

The time recorder 14 is utilized for recording the total oscillating time Tt. The knee detecting module 15 is utilized for receiving at least one signal selected from the group consisting of the first signal S1 and the second signal S2 to control the time recorder 14. Concretely speaking, the voltage oscillating waveform 200 would be generated on the divider resistors 24 and 25 as the switch 22 is turned off. In accordance with a preferred embodiment of the present invention, the voltage oscillating waveform 200 is divided into time zones A, B, C, and D. The time recorder 14 would calculate a first oscillating time T1 as the first switch Sa is conducted during time zone A, and the time recorder 14 would be triggered to recount the first oscillating time T1 as the knee detecting module 15 receives the first signal S1. For example, in accordance with a preferred embodiment of the present embodiment, as the voltage oscillating waveform 200 is lower than Va at time t1 (which is corresponding to point Z1 in the figure), the first comparing output 123 of the first comparator 12 would be triggered to transmit the first signal S1 (as shown in the waveform 300 of FIG. 5A, the first signal S1 is a high level signal representing digital [1]) so as to have the time recorder 14 recount the first oscillating time T1. Thus, the time recorder 14 begins to recount the oscillating time at time t1. As shown in FIGS. 4 and 4A, as the first signal S1 is digital [1], the NOR gate 157 receiving the first signal S1 would output the digital signal [0] as the trigger signal to reset the timer 141 so as to recount the oscillating time. Then, if the knee detecting module 15 does not receive the first signal S1 within the first oscillating time T1, the timer 141 would record the first oscillating time T1 after the end of the first oscillating time T1 and transmit a trigger signal S5 to the counter 142 to have the counter 142 conduct the second switch Sc such that the second oscillating time T2 would be calculated and the time zone B begins.

In time zone B, the first switch Sa maintains the state of conduction and the second switch Sc is conducted. Similarly, the knee detecting module 15 triggers the time recorder 14 to calculate the above mentioned second oscillating time T2. At time t2, the voltage oscillating waveform 200 is lower than Vc (which is corresponding to point Z2 in the figure) to trigger the second comparing output 133 of the second comparator 13 to transmit the second signal S2 (as shown in the waveform 400 of FIG. 5A, the second signal S2 is a high level signal representing digital [1]) to have the knee detecting module 15 trigger the time recorder 14 to recount the second oscillating time T2. Thus, the time recorder 14 begins to recount the second oscillating time T2 at time t2. Then, if the time recorder 14 does not receive the second signal S2 within the second oscillating time T2, the time recorder 14 would record the second oscillating time T2 and conduct the third switch Sb (the recording method and the triggering method are identical to that for the first oscillating time T1 and thus are not repeated here) such that the third oscillating time T3 would be calculated and the time zone C begins. In time zone C, the first switch Sa is turned off but the second switch Sc is still conducted.

Similarly, after recording the third oscillating time T3, the fourth switch Sd would be conducted and the time zone D begins. In accordance with the preferred embodiment of the present invention, the third comparator 12a or the fourth comparator 13a was not triggered to transmit the output signals. It is noted that, as the time zone D begins, the voltage oscillating waveform 200 goes down to touch the levels of the first reference voltage Va, Vb, and the second reference voltage Vc, Vd after the fourth oscillating time T4. That is, as the knee detecting module 15 does not receive the second signal S2 but receives the first signal S1 within the fourth oscillating time T4, the processing unit 156 would detect the knee dn. Meanwhile, the knee detecting module 15 would notify the time recorder 14 that oscillation of the voltage oscillating waveform 200 was stopped, such that in addition to calculating the fourth oscillating time T4, the time recorder 14 may also sum up the first oscillating time T1, the second oscillating time T2, the third oscillating time T3, and the fourth oscillating time T4, and the recounted time t1 and t2 as the total oscillating time Tt to be recorded. In accordance with the other preferred embodiments, the first oscillating time T1, the second oscillating time T2, the third oscillating time T3, and the fourth oscillating time T4 may be identical.

In addition, in the other embodiment, the timer 142 of the time recorder 14 is set with an oscillating threshold time, which is utilized for computing the smallest oscillating time in the time zones. For example, in time zone A, the knee detecting module 15 would conduct the second switch Sc to enter the time zone B as the knee detecting module 15 does not receive the first signal S1 within the oscillating threshold time, and the first oscillating time T1 calculated by the time recorder 14 would be identical to the oscillating threshold time. That is, if the oscillating threshold time is set as 2 seconds, the first oscillating time T1 would be also 2 seconds. Similarly, in the time zone B, the knee detecting module 15 would conduct the third switch Sb to enter the time zone C as the knee detecting module 15 does not receive the second signal S2 within the oscillating threshold time, and the second oscillating time T2 calculated by the time recorder 14 would be identical to the oscillating threshold time, i.e. 2 seconds.

In the time zone A, if the knee detecting module 15 has received the first signal S1 within the oscillating threshold time, the time recorder 14 would be triggered to recount the oscillating threshold time again until there has no first signal S1 been received within the oscillating threshold time. Assuming that there has no first signal S1 been received within the recounted next oscillating threshold time, the oscillating time to be recorded would be the sum of the duration before the time recorder 14 was triggered by the first signal S1 and the oscillating threshold time. That is, if the knee detecting module 15 receives the first signal S1 after the oscillation of 1 second, the time recorder 14 would keep calculating the next oscillating threshold time, and if the knee detecting module 15 does not receive the first signal S1 within the second oscillating threshold time (i.e. the next oscillating threshold time), the oscillating threshold time of 2 seconds would be aggregated to the above mentioned 1 second to generate the first oscillating time of 3 seconds. The operations in time zone B to time zone D are similar and thus are not repeated here. However, the present invention is not so restricted and the other embodiments may adopt different operation to calculate the oscillating time.

In other words, the time recorder 14 calculates the above mentioned oscillating threshold time. The knee detecting module 15 will start to calculate the second oscillating time if the knee detecting module 15 does not receive the first signal S1. However, if the knee detecting module 15 does receive the first signal S1 within the oscillating threshold time, it will recount the oscillating threshold time again until there has no first signal S1 been received within the oscillating threshold time.

In other words, if the knee detecting module 15 receives the first signal S1 within the oscillating threshold time, the time recorder 14 would be triggered to recount oscillating the threshold time again, and the first oscillating time would be calculated as the oscillating threshold time plus the calculated time after then. If the knee detecting module 15 does not receive the first signal S1 within the oscillating threshold time, the time recorder 14 would be triggered to record the oscillating threshold time as the first oscillating time, and the knee detecting module 15 would further conduct the second switch for calculating the second oscillating time. Similarly, if the knee detecting module 15 receives the second signal S2 within the oscillating threshold time, the time recorder 14 would be triggered to recount the oscillating threshold time again and the second oscillating time would be calculated as the oscillating threshold time plus the calculated time after then. If the knee detecting module 15 does not receive the second signal S2 within the oscillating threshold time, the time recorder 14 would be triggered to record the oscillating threshold time as the second oscillating time. The knee detecting module 15 would detect the knee and trigger the time recorder 14 to sum up the above mentioned first oscillating time and the second oscillating time to calculate the total oscillating time if the knee detecting module 15 does not receive the second signal S2 but receives the first signal S1.

As supplements, within the second oscillating time T2 (or the fourth oscillating time T4, for which the second oscillating time T2 in this paragraph should be replaced by the fourth oscillating time T4), the first switch Sa, the second switch Sc, the fifth switch Se, the sixth switch Sg, the first detecting switch 152, and the fourth detecting switch 155 are conducted. The knee detecting module 15 would trigger the time recorder 14 to recount the second oscillating time T2 when receiving the second signal S2 or the fourth signal S4, and trigger the time recorder 14 to record the second oscillating time T2 as the knee detecting module 15 does not receive the second signal S2 or the fourth signal S4 (the NOR gate 158 may generate logic NOR of the second signal S2 and the fourth signal S4, and both the second signal S2 and the fourth signal S4 are high level signals of digital [1]). In addition, the processing unit 156 would record the knee dn as the knee detecting module 15 receives the first signal S1 or the third signal S3.

In addition, within the first oscillating time T1 (or the third oscillating time T3, for which the first oscillating time T1 in this paragraph should be replaced by the third oscillating time T3), the third switch Sb, the fourth switch Sd, the seventh switch Sf, the eighth switch Sh, the second detecting switch 153 and the third detecting switch 154 are conducted. The knee detecting module 15 would trigger the time recorder 14 to recount the first oscillating time T1 when receiving the first signal S1 or the third signal S3 (the NOR gate 157 may generate logic NOR of the first signal S1 and the third signal S3, and both the first signal S1 and the third signal S3 are high level signals of digital [1]), and trigger the time recorder 14 to record the first oscillating time T1 as the knee detecting module 15 does not receive the first signal S1 or the third signal S3. In addition, the processing unit 156 would record the knee dn as the knee detecting module 15 receives the second signal S2 or the fourth signal S4.

The voltage oscillating waveform is divided into four zones in accordance with the present preferred embodiment. However, the present invention is not so restricted. In accordance with the other embodiments, the voltage oscillating waveform may be merely divided into two zones. In case there have only two zones, only one input signal would be received by the first comparing input 121 of the first comparator 12 and the third comparing input 131 of the second comparator 13, which are the first reference voltage Va and the second reference voltage Vc respectively. The time recorder 14 would recount the second oscillating time T2 when receiving the second signal S2, and the time recorder 14 would sum up the first oscillating time and the second oscillating time to calculate the total oscillating time Tt when receiving the first signal S1 again after the second signal S2 was received (i.e. the voltage oscillating waveform 200 stops oscillating and goes down).

The time recorder 14 transmit the total oscillating time Tt to the processing module (not shown, which may be composed of circuitry components) at the feedback end (i.e. COMP end) of the circuit 1 for detecting a knee of waveform. The processing module uses the voltage signal at the current sense end (i.e. CS end), the above mentioned total oscillating time Tt, and the PWM cycle for controlling on/off of the switch 22 to do the calculation. For example, the control current may be calculated as Vcs*(Tt/PWM) cycle, and the control current can be further used for stabilize the average output current Ib. However, the present invention is not so restricted.

In addition, as shown in FIG. 5, there are four comparators used in the present embodiment, that is, the first comparator 12 and the second comparator 13 compares the lower half of the voltage oscillating waveform 200 centered at the filtered voltage $V_{ZCDF}$, and the third comparator 12a and the fourth comparator 13a compares the upper half of the voltage oscillating waveform 200 (i.e. $V_{ZCD}$) centered at the filtered voltage $V_{ZCDF}$. However, the present invention is not so restricted. In accordance with the other embodiments, there may have only two comparators, such as the first comparator 12 and the second comparator 13. The difference is that the embodiment with only two comparators adopts the method of one-sided detecting, which is less precise than the above mentioned two-sided detecting.

Figure 6:
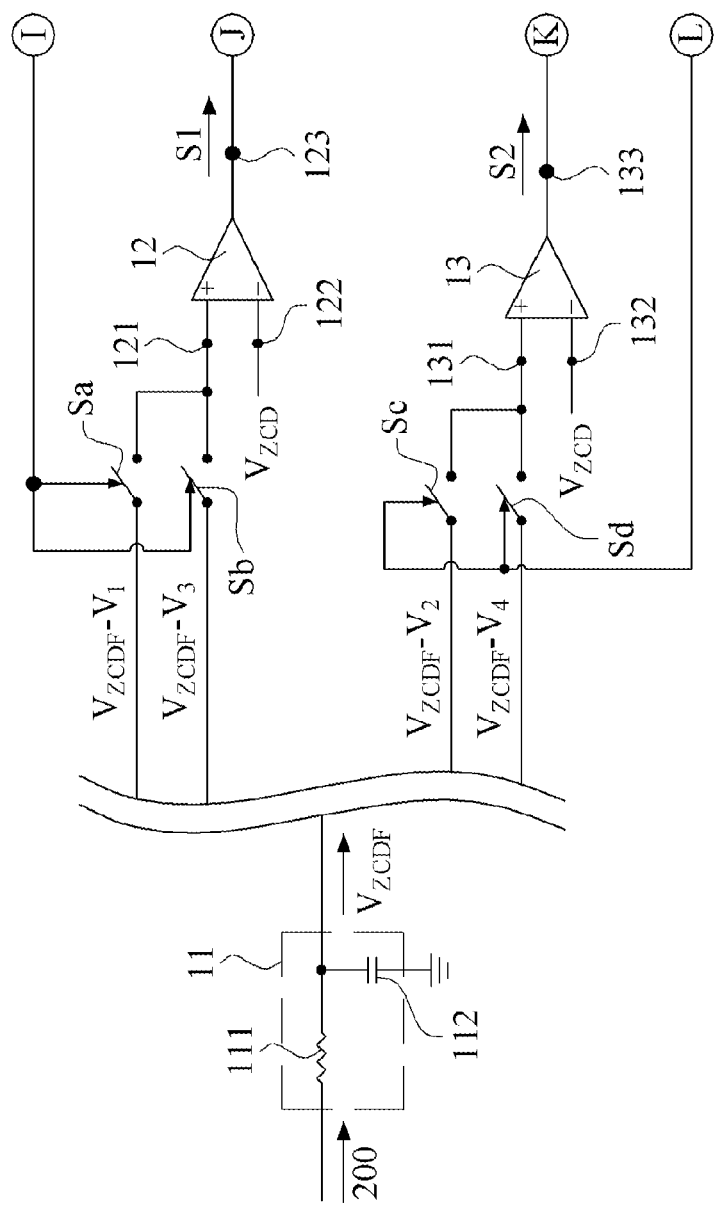
FIGS. 6 and 6A are circuit diagrams of the circuit for detecting a knee of waveform in accordance with a second preferred embodiment of the present invention.
Figure 6A:
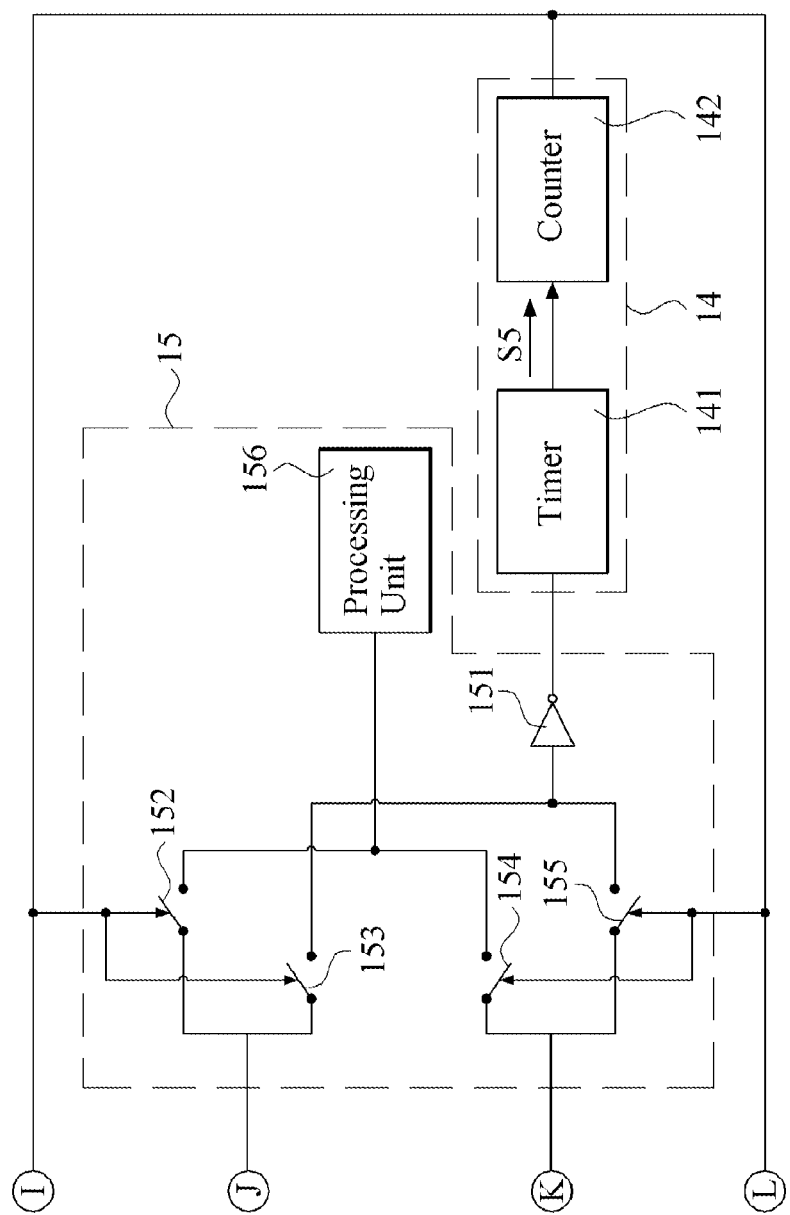

For example, FIGS. 6 and 6A show the circuitry of the circuit for detecting a knee of waveform in accordance with a second preferred embodiment of the present invention. As shown, the difference between the present embodiment and the first preferred embodiment is that, the present embodiment adopts one-sided detecting such that the third comparator 12a, the fourth comparator 13a, the first NOR gate 157 and the second NOR gate 158 are skipped, the NOT gate 151 is changed to be electrically connected to the second detecting switch 153, the fourth detecting switch 155 and the timer 141 of the time recorder 14, and the processing unit 156 is changed to be electrically connected to the first detecting switch 152 and the third detecting switch 154 directly.

Regarding the operation of the second preferred embodiment of the circuit for detecting a knee of waveform, for example, within the first oscillating time, the first detecting switch 152 and the fourth detecting switch 155 would be conducted by the timer 142 of the time recorder 14, within the second oscillating time, the second detecting switch 153 and the third detecting switch 154 would be conducted by the timer 142 of the time recorder 14, and the other technologies for detecting the knee and calculating the total oscillating time are similar to the first preferred embodiment and thus are not repeated here.

Please refer to FIG. 7, which is a waveform diagram showing the reference stabilized voltage under the influence of the voltage oscillating waveform in accordance with the other embodiment of the present invention. As shown in FIG. 7, the huge oscillation at the beginning of the voltage oscillating waveform 500 may influence the filtered reference stabilized voltage by having the reference stabilized voltage oscillated as shown in the waveform 600 of FIG. 6. There would be some misjudgment when using the circuit 1 for detecting a knee of waveform in accordance with the preferred embodiment of the present invention to calculate the oscillating time based on the above mentioned waveform. Concretely speaking, the time recorder 14 may wrongly record the second oscillating time T2a after recording the first oscillating time T1a. That is, the portion at point Z3 would be misjudged as there has no further oscillation in the voltage oscillating waveform 500 and the waveform begins to decline (because the lower portion of the voltage oscillating waveform 500 has overpassed the previous preset voltage). At this time, the recorded total oscillating time Tta would be the sum of the first oscillating time T1a and the second oscillating time T2a, but in fact, the correct total oscillating time should be Ttb. Such drawback would be improved in the following embodiment of the present invention.

Figure 8:
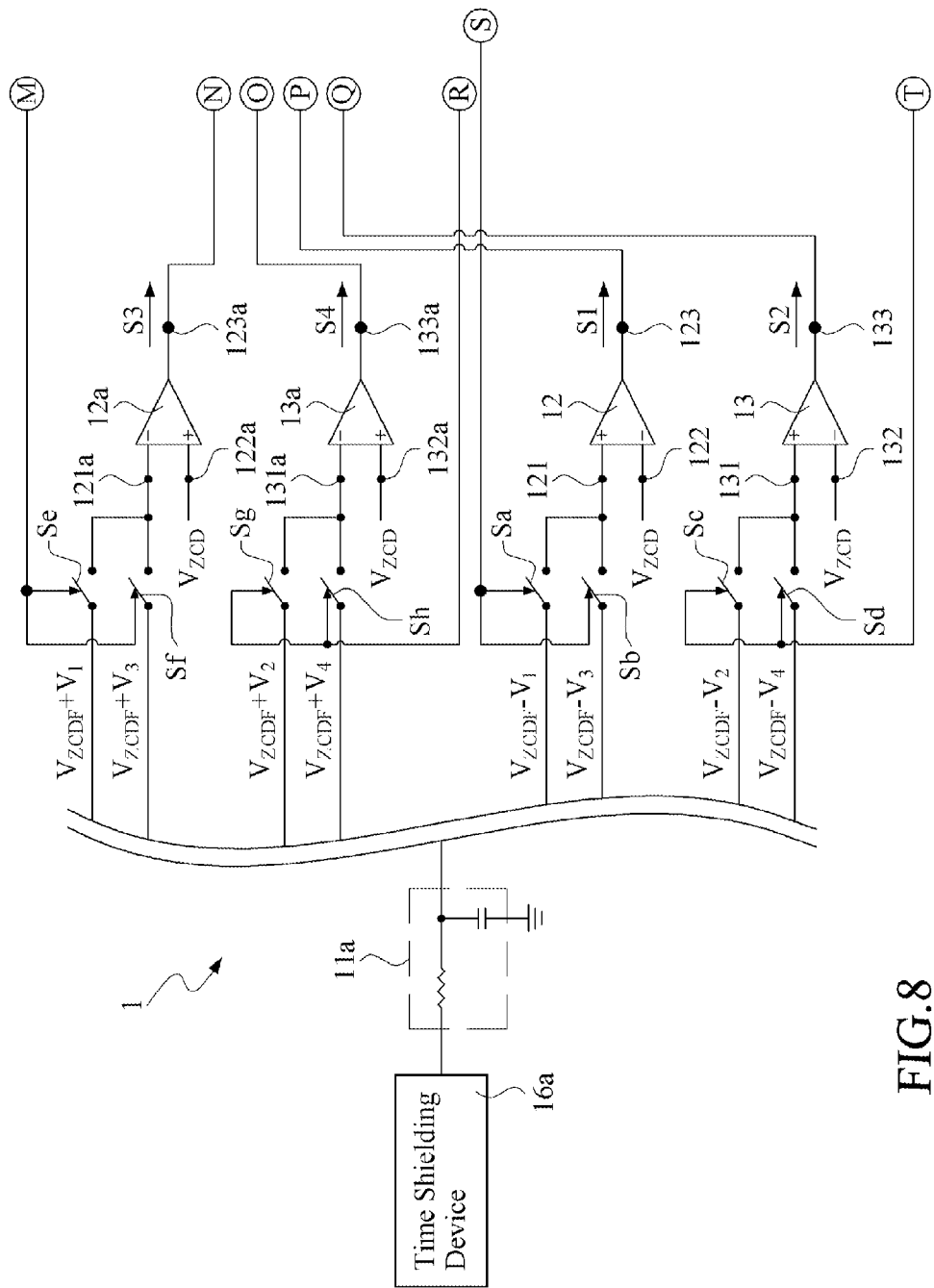
FIGS. 8 and 8A are circuit diagrams of the isolated load circuit in accordance with the other embodiment of the present invention.
Figure 8A:
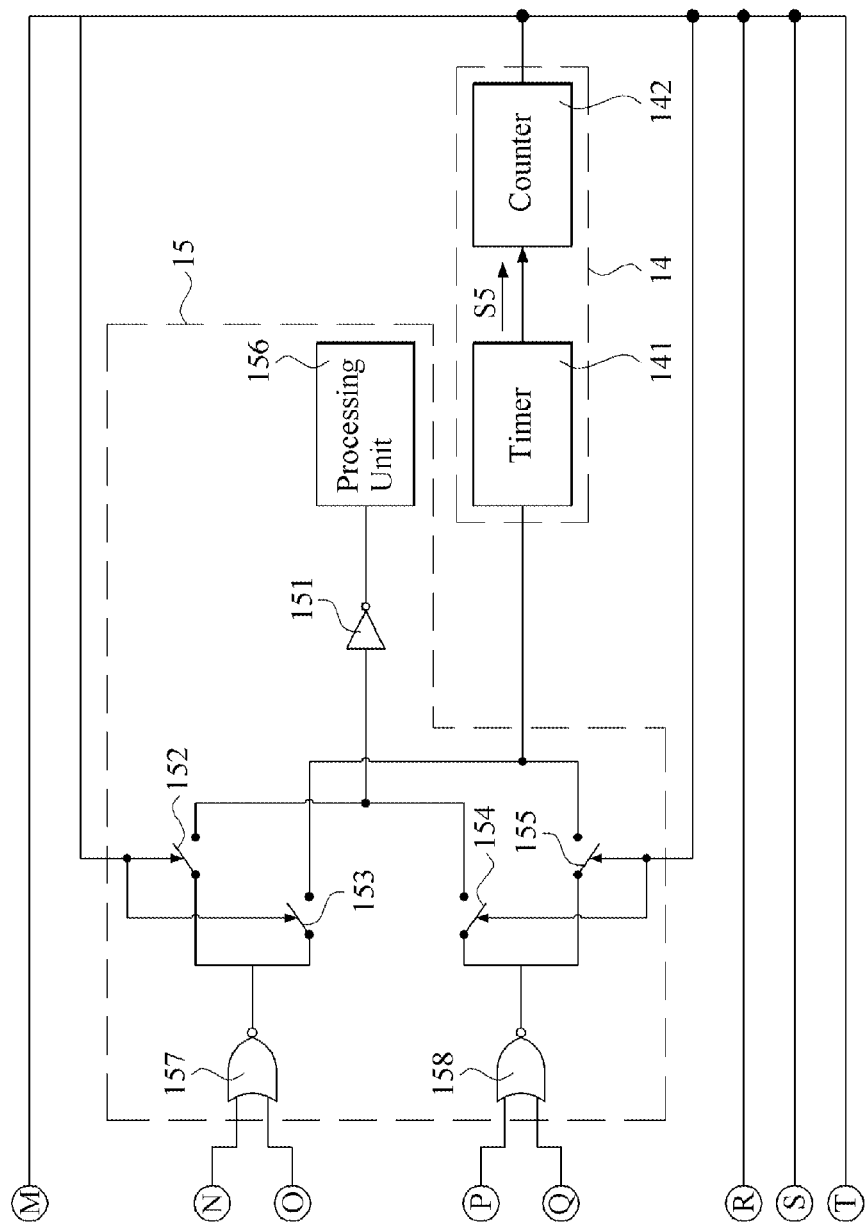
Figure 9:
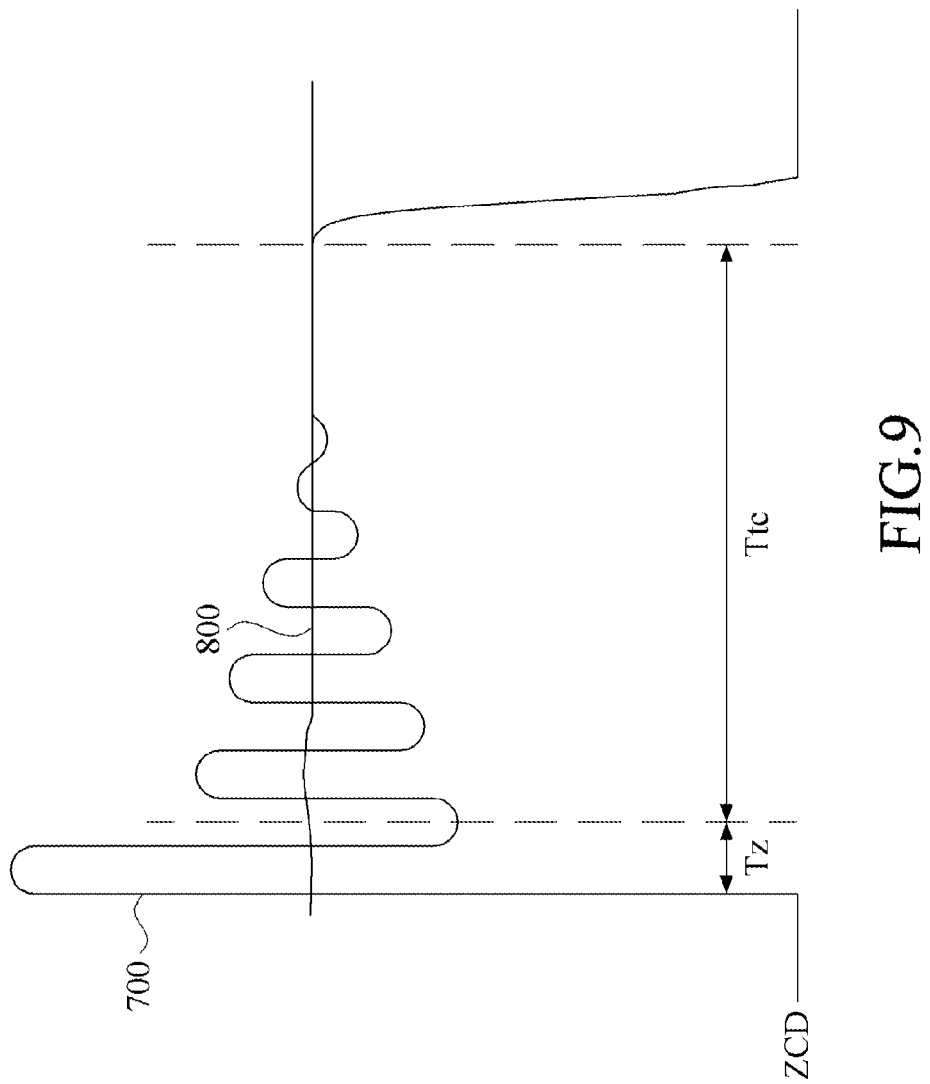
FIG. 9 is a waveform diagram showing the improved reference stabilized voltage under the influence of the voltage oscillating waveform in accordance with the other embodiment of the present invention.

Please refer to FIGS. 8 to 9, wherein FIGS. 8 and 8A are circuit diagrams of the isolated load circuit in accordance with the other embodiment of the present invention, and FIG. 9 is a waveform diagram showing the improved reference stabilized voltage under the influence of the voltage oscillating waveform in accordance with the other embodiment of the present invention. As shown, different from the above mentioned preferred embodiment, the present embodiment integrates a time shielding device 16a, which is electrically connected between the filter 11a and the divider resistors (not shown) of the auxiliary winding (not shown) to delay the voltage oscillating waveform 700 transmitted to the filter 11a for a delay time Tz. The other portions are identical to the above mentioned preferred embodiment. Because the voltage oscillating waveform 700 transmitted to the filter is shielded for a delay time Tz, the oscillating amplitude suffered by reference stabilized voltage $V_{ZCDF}$ would be smaller (i.e. the waveform 800 as shown in FIG. 9). That is, in accordance with the present embodiment, detecting preciseness is enhanced through delaying the judging time.

In conclusion, by using the circuit for detecting a knee of waveform provided in the present invention, the total oscillating time can be calculated to compute the compensating current, which can be transmitted to the COMP end of the conventional driving circuit to stabilize the average current so as to resolve the problem of conventional art.

The detail description of the aforementioned preferred embodiments is for clarifying the feature and the spirit of the present invention. The present invention should not be limited by any of the exemplary embodiments described herein, but should be defined only in accordance with the following claims and their equivalents. Specifically, those skilled in the art should appreciate that they can readily use the disclosed conception and specific embodiments as a basis for designing or modifying other structures for carrying out the same purposes of the present invention without departing from the scope of the invention as defined by the appended claims.

What is claimed is:

1. A circuit for detecting a knee of a voltage oscillating waveform, applicable to an isolated load circuit, which includes an isolated transformer with a primary side winding, a second side winding, and an auxiliary winding, a primary side switch, and at least one operating element, wherein the primary side switch is electrically connected to the primary side winding of the isolated transformer, the operating element is electrically connected to the secondary side winding of the isolated transformer, the auxiliary winding is disposed at the same side of the primary winding, utilized for detecting the knee of the voltage oscillating waveform of the auxiliary winding and a total oscillating time so as to control an average output current flowing through the operating element by using the knee and the total oscillating time as the primary side switch is turned off, and the circuit for detecting a knee of a voltage oscillating waveform comprising:

a filter, electrically connected to the auxiliary winding for receiving and filtering the voltage oscillating waveform to generate a filtered voltage;

a first comparator, having a first comparing input, a second comparing input, and a first comparing output, the first comparing input being electrically connected to the filter through a first switch for receiving at least a first reference voltage which is a difference between the filtered voltage and a first preset voltage and is positive, the second comparing input being electrically connected to the auxiliary winding for receiving the voltage oscillating waveform, and the first comparing output being utilized for transmitting a first signal as the voltage oscillating waveform reaches the first reference voltage;

a second comparator, having a third comparing input, a fourth comparing input, and a second comparing output, the third comparing input is electrically connected to the filter through a second switch for receiving at least one second reference voltage which is a difference between a reference stabilized voltage and a second preset voltage and is greater than the first reference voltage, the second preset voltage is positive, the fourth comparing input being electrically connected to the auxiliary winding for receiving the voltage oscillating waveform, and the second comparing output being utilized for transmitting a second signal as the voltage oscillating waveform reaches the second reference voltage;

a time recorder, electrically connected to the first comparing output of the first comparator, the second comparing output of the second comparator, the first switch, and the second switch for recording the total oscillating time; and a knee detecting module, electrically connected to the first comparator, the second comparator, and the time recorder, for receiving at least one of the first signal and the second signal to control the time recorder accordingly;

wherein, as the first switch is conducted, the time recorder counts a preset first oscillating time, the knee detecting module triggers the time recorder to recount the first oscillating time when the knee detecting module receives the first signal within the first oscillating time, and the knee detecting module triggers the time recorder to record the first oscillating time when the knee detecting module does not receive the first signal within the first oscillating time and then the knee detecting module further conducts the second switch to count a preset second oscillating time, the knee detecting module triggers the time recorder to recount the second oscillating time when the knee detecting module receives the second signal within the second oscillating time, and the knee detecting module triggers the time recorder to record the second oscillating time when the knee detecting module does not receive the second signal within the second oscillating time, and the knee detecting module detects the knee and triggers to the time recorder to sum up the first oscillating time and the second oscillating time to record the total oscillating time when the knee detecting module does not receive the second signal within the second oscillating time but receives the first signal;

wherein the knee detecting module comprises:
- a first detecting switch, electrically connected to the first comparator and the time recorder;
- a second detecting switch, electrically connected to the first comparator and the time recorder;
- a third detecting switch, electrically connected to the second comparator and the time recorder;
- a fourth detecting switch, electrically connected to the second comparator and the time recorder; and
- a processing unit, electrically connected to the first detecting switch and the third detecting switch;
- wherein, within the first oscillating time, the first detecting switch and the fourth detecting switch are conducted by the time recorder, and the second detecting switch and the third detecting switch are turned off by the time recorder, and within the second oscillating time, the second detecting switch and the third detecting switch are conducted by the time recorder, and the first detecting switch and the fourth detecting switch are turned off by the time recorder.

2. The circuit for detecting a knee of a voltage oscillating waveform of claim 1, wherein the time recorder comprises:
- a timer, electrically connected to the first comparing output of the first comparator, the second comparing output of the second comparator, for transmitting a trigger signal when the knee detecting module does not receive the first signal within the first oscillating time; and
- a counter, electrically connected to the timer, the first switch, and the second switch, for conducting the second switch when receiving the trigger signal.

3. The circuit for detecting a knee of a voltage oscillating waveform of claim 1, wherein the operating element is a light emitted diode.

4. The circuit for detecting a knee of a voltage oscillating waveform of claim 1, further comprising a time shielding device, electrically connected between the filter and the auxiliary winding to delay the voltage oscillating waveform transmitted to the filter for a delay time.

5. The circuit for detecting a knee of a voltage oscillating waveform of claim 1, wherein the filter includes a resistor and a capacitor, the resistor is electrically connected to the auxiliary winding, the capacitor has one end electrically connected to the resistor and another end grounded.

6. The circuit for detecting a knee of a voltage oscillating waveform of claim 1, wherein the first signal and the second signal are high level signals.

7. The circuit for detecting a knee of a voltage oscillating waveform of claim 1, wherein the time recorder is set with an oscillating threshold time, the first oscillating time counted by the time recorder is set as identical to the oscillating threshold time and the second oscillating time counted by the time recorder is set as identical to the oscillating threshold time when the knee detecting module does not receive the second signal within the oscillating threshold time.

8. The circuit for detecting a knee of a voltage oscillating waveform of claim 1, wherein the first comparing input of the first comparator is electrically connected to the filter through a third switch, the third comparing input of the second comparator is electrically connected to the filter through a fourth switch, and the circuit for detecting a knee of a voltage oscillating waveform further comprises:
- a third comparator, having a fifth comparing input, a sixth comparing input, and a third comparing output, the fifth comparing input being electrically connected to the filter through a fifth switch and also electrically connected to the filter through a seventh switch, the fifth comparing input being utilized for receiving at least a third reference voltage which is a sum of the reference stabilized voltage and the first preset voltage, the sixth comparing input being electrically connected to the auxiliary winding for receiving the voltage oscillating waveform, and the third comparing output being utilized for transmitting a third signal as the voltage oscillating waveform reaches the third reference voltage; and
- a fourth comparator, having a seventh comparing input, an eighth comparing input, and fourth comparing output, the seventh comparing input being electrically connected to the filter through the seventh switch and also electrically connected to the filter through an eighth switch, the seventh comparing input being utilized for receiving at least a fourth reference voltage which is a sum of the reference stabilized voltage and the second preset voltage and also smaller than the third reference voltage, the eighth comparing input being electrically connected to the auxiliary winding for receiving the voltage oscillating waveform, and the fourth comparing output being utilized for transmitting a fourth signal as the voltage oscillating waveform reaches the fourth reference voltage;
- wherein, the knee detecting module is electrically connected to the first comparator, the second comparator, the third comparator, the fourth comparator, and the time recorder, and as the first switch, the second switch, the fifth switch, the sixth switch, the first detecting switch and the fourth detecting switch are conducted, the knee detecting module triggers the time recorder to recount the second oscillating time when the knee detecting module receives the second signal or the fourth signal within the second oscillating time, records the second oscillating time when the knee detecting module does not receive the second signal or the fourth signal within the second oscillating time within the second oscillating time, and the processing unit records the knee when the knee detecting module receives the first signal or the third signal;
- wherein, as the third switch, the fourth switch, the seventh switch, the eighth switch, the second detecting switch and the third detecting switch are conducted, the knee detecting module triggers the time recorder to recount the first oscillating time when the knee detecting module receives the first signal or the third signal within the first oscillating time, triggers the time recorder to recount the first oscillating time when the knee detecting module does not receive the first signal or the third signal within the first oscillating time, and the processing unit records the knee when the knee detecting module receives the second signal or the fourth signal within the first oscillating time;
- wherein the third signal and the fourth signal are digital high level signals.

9. The circuit for detecting a knee of a voltage oscillating waveform of claim 8, wherein the knee detecting module further comprises:
- a first NOR gate, electrically connected to the first comparator, the third comparator, the first detecting switch, and the second detecting switch, for computing logic NOR of the first signal and the third signal; and
- a second NOR gate, electrically connected to the second comparator, the fourth comparator, the third detecting switch, and the fourth detecting switch, for computing logic NOR of the second signal and the fourth signal.

* * * * *